United States Patent
Xu et al.

(10) Patent No.: US 12,287,382 B1
(45) Date of Patent: Apr. 29, 2025

(54) GENERATION METHOD AND SIMULATION METHOD OF MAGNETIC CONFIGURATION OF MAGNETIC MATERIAL

(71) Applicant: GRADUATE SCHOOL OF CHINA ACADEMY OF ENGINEERING PHYSICS, Beijing (CN)

(72) Inventors: Ben Xu, Beijing (CN); Ping Zhang, Beijing (CN)

(73) Assignee: GRADUATE SCHOOL OF CHINA ACADEMY OF ENGINEERING PHYSICS, Beijing (CN)

( * ) Notice: Subject to any disclaimer, the term of this patent is extended or adjusted under 35 U.S.C. 154(b) by 0 days.

(21) Appl. No.: 18/951,800

(22) Filed: Nov. 19, 2024

(30) Foreign Application Priority Data

Nov. 20, 2023 (CN) .......................... 202311553736.7

(51) Int. Cl.
  *G01R 33/12* (2006.01)
  *G01N 23/207* (2018.01)
  *G01R 33/025* (2006.01)

(52) U.S. Cl.
  CPC ....... *G01R 33/1284* (2013.01); *G01N 23/207* (2013.01); *G01R 33/025* (2013.01)

(58) Field of Classification Search
  CPC ................ G01N 23/207; G01R 33/025; G01R 33/1284; G01R 33/00; G01R 33/0035; G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
  See application file for complete search history.

(56) References Cited

U.S. PATENT DOCUMENTS

2010/0109657 A1* 5/2010 Voegeli .............. G01R 33/1269
  324/214

FOREIGN PATENT DOCUMENTS

| CN | 207301301 U | * | 5/2018 | ............... G01L 1/24 |
| CN | 109001651 A | * | 12/2018 | ............. G01R 33/14 |
| JP | 2019030623 A | * | 2/2019 | ............... A61B 6/00 |

* cited by examiner

*Primary Examiner* — Jermele M Hollington
*Assistant Examiner* — Taqi R Nasir
(74) *Attorney, Agent, or Firm* — IPRO, PLLC

(57) ABSTRACT

A generation method for a magnetic configuration of a magnetic material includes: obtaining an initial magnetic configuration and an initial atomic configuration of the magnetic material; and randomly generating a variety of random configuration combinations; selecting one of the random configuration combinations as a target magnetic configuration and a target atomic configuration, to obtain a constraint constant and a wave function of the target magnetic configuration; determining energy, temperature and pressure, and storing them; returning to select a new random configuration combination, and repeating the above steps by using different magnetic materials; obtaining the magnetic material of a specified phase transition temperature. The present disclosure also provides and a simulation method for a magnetic configuration of a magnetic material, which can simulate the target magnetic configuration to form a magnetic configuration library and guide the synthesis of the target magnetic materials.

13 Claims, 5 Drawing Sheets

GENERATION METHOD AND SIMULATION METHOD OF MAGNETIC CONFIGURATION OF MAGNETIC MATERIAL

TECHNICAL FIELD

This disclosure relates to the field of material science and computer technology, particularly to a generation method and a simulation method for a magnetic configuration of a magnetic material.

BACKGROUND

The performance of a magnetic material is typically a result of the combined effects of the magnetic configuration and the atomic configuration. One magnetic configuration may correspond to multiple potential atomic configurations due to different combinations of atoms or ions, and their interaction patterns, may exhibit identical magnetic behavior. Conversely, if only knowing the atomic configuration, it is insufficient to determine its magnetic configuration, as factors such as electron spin, orbital motion, and superexchange interactions must also be considered.

Magnetic constraint refers to obtaining magnetic configurations in the magnetic material deviating from a magnetic ground state, and employing localized potential fields to restrict local distribution of electrons in magnetic material. A fundamental principle of magnetic constraint lies in that electrons with different spin directions have different spatial distributions. However, the magnetic constraint in the existing art has poor constraint effects, being able to constrain atomic magnetic moment under collinear representation, or constrain either orientation or magnitude of the magnetic moment, but not both simultaneously with precision. A constraint algorithm depends on initial parameters, lacking adaptability to a new system and configuration, with convergence difficulties in some systems. It is possible to constraint only through electron iteration under an energy functional, with slow convergence and low precision. The method not integrated with commonly used plane wave first principle calculation software is unable to utilize its high-performance algorithm and high-precision pseudopotential library, making it difficult to use and promote. It is unable to selectively apply constraints to some atoms, thereby easily introducing unreasonable restrictions on non-magnetic atoms.

SUMMARY

The present disclosure aims to address at least one of the technical problems in related art to a certain extent.

A first object of the present disclosure is to form a magnetic configuration library, using which, through a deep learning model, to guide synthesis of magnetic materials, while improving existing magnetic constraint methods in the process of forming the magnetic configuration library. Specifically, the present disclosure involves using a magneto-optical Kerr measurement system to measure the magnetic material to obtain an initial magnetic configuration, using an X-ray diffractometer to perform diffraction on the magnetic material to obtain an initial atomic configuration, employing a superconducting quantum interference device to measure a phase transition temperature of the magnetic material as known, and using the phase transition temperature, the magnetic configuration, the atomic configuration, of the magnetic material, and energy, temperature and pressure to train the deep learning model; and using the trained deep learning model with the magnetic configuration library to obtain the magnetic material with a specified phase transition temperature.

A second object of the present disclosure is to propose a simulation method for a magnetic configuration. Based on the initial magnetic configuration theoretically, a first principle magnetic constraint method is used to obtain a constraint constant and a wave function for the target magnetic configuration, thereby enabling the simulation and analysis of the target magnetic configuration.

To achieve the above objects, a first aspect of the present disclosure proposes a generation method for a magnetic configuration of a magnetic material, including:

step 1: using a magneto-optical Kerr measurement system to measure the magnetic material and obtaining an initial magnetic configuration of the magnetic material, turning off the magneto-optical Kerr system, using an X-ray diffractometer to perform diffraction on the magnetic material to obtain an initial atomic configuration, and then turning off the X-ray diffractometer;

step 2: for the initial magnetic configuration and the initial atomic configuration, randomly generating M random magnetic configurations and N random atomic configurations, thereby creating M×N random configuration combinations, and both M and N being a positive integer;

step 3: selecting one of the random configuration combinations from step 2 as the target magnetic configuration and the target atomic configuration, according to a Hamiltonian of the magnetic configuration, employing a self-consistent iteration to obtain a constraint constant and a wave function of the target magnetic configuration;

step 4: based on the target magnetic configuration, the target atomic configuration, the constraint constant and the wavefunction of the target magnetic configuration, determining energy, temperature, and pressure of the target magnetic configuration, and storing the target atomic configuration, the target magnetic configuration, the constraint constant and the wave function of the target atomic configuration, the energy, the temperature, and the pressure of the magnetic material in a magnetic configuration library;

step 5: returning to step 3, selecting a new random configuration combination from step 2 as the target magnetic configuration and the target atomic configuration, and performing step 6 until all of the random combinations are selected as the target magnetic configuration and the target atomic configuration;

step 6: updating the magnetic material, and then restarting the magneto-optical Kerr measurement system and the X-ray diffractometer, and performing steps 1 to 5, and performing step 7 when a number of the magnetic configuration and the atomic configuration in the magnetic confirmation library reaches a preset value;

step 7: using a superconducting quantum interference device to measure a magnetic material to obtain a phase transition temperature, and using the phase transition temperature of the magnetic material, the magnetic configuration, the atomic configuration, and the energy, the temperature and the pressure of the magnetic material to train a deep learning model, and then using the trained deep learning model to obtain the magnetic material in a specified range of the phase transition temperature through the magnetic configuration database.

Optionally, step 331: initializing the constraint constant $v^{\alpha a}$ to 0 and obtaining a target magnetic moment based on the target magnetic configuration;

step 332: with the constraint constant $v^{\alpha a}$, using the Hamiltonian of the initial magnetic configuration to solve a KS equation to obtain a corresponding wave function $\psi$ as an electron density, determining the wave function $\psi$ according to the following equation:

$$\{H^{KS}+H^{v}\}|\psi_{n\sigma}\rangle = \epsilon_n|\psi_{n\sigma}\rangle;$$

wherein $H^{KS}$ represents the KS equation, $H^V$ represents the Hamiltonian of the magnetic system, $\psi_{n\sigma}$ represents a $\sigma$ component of a spinon wave function, $\epsilon_n$ represents an eigenvalue, and n represents a $n^{th}$ electron energy level;

step 333: using a function $M(\Delta v^{\alpha a})$ to update a magnetic moment M of an atom based on the wave function $\psi$ and the constraint constant $v^{\alpha a}$, wherein, the function $M(\Delta v^{\alpha a})$ is determined by a following formula:

$$\Delta H^v(r) \leftarrow -\Delta v^{\alpha a} P_{\sigma\sigma'}{}^{\alpha} \Theta(r^{cut}-|r-r^a|);$$

$$\{H^{KS}+H^v+\Delta H^v\}|\psi_{n\sigma}\rangle = \epsilon_n|\psi_{n\sigma}\rangle$$

$$m^{\alpha}(r) \leftarrow f_n P_{\sigma\sigma'}{}^{\alpha} \omega_{n\sigma}(r)\psi_{n\sigma'}(r);$$

$$M^{\alpha a} \leftarrow \int d^3 r m^{\alpha}(r)\Theta(r^{cut}-|r-r^a|);$$

wherein $H^V(r)$ represents the Hamiltonian of the magnetic system, $v^{\alpha a}$ represents the constraint constant, $P_{\sigma\sigma'}{}^{\alpha}$ represents a Pauli matrix in the $\alpha$ direction, $\theta(\cdot)$ represents a cutoff function, $r^{cut}$ represents a cutoff radius, r represents a real space coordinate, $r^a$ represents a real space coordinate of an atom a, $M^{\alpha a}$ represents a magnetic moment of atom a in an $\alpha$ direction; $m^{\alpha}(r)$ represents a spin density in the $\alpha$ direction, $f_n$ represents an occupation number on an orbital, $\psi_{n\sigma}$ represents a $\sigma$ component of the spinon wave function, $\psi_{n\sigma'}$ represents a $\sigma'$ component of the spinon wave function; $d^3r$ represents a three-dimensional differential symbol;

step 334: determining whether a difference between the atomic magnetic moment and the target magnetic moment is greater than a preset threshold; if the difference is not greater than the present threshold, performing the step 335, and if the difference is greater than the present threshold, updating the constraint constant $v^{\alpha a}$ according to the following equation and returning to the step 332, and then using a new constraint constant:

$$LCO(M, M_{target}^{\alpha a}) \equiv \operatorname*{argmin}_{\Delta v^{\alpha a}} \sum_{a\alpha} (M^{\alpha a} - M_{target}^{\alpha a})^2$$

$$\Delta v^{\alpha a} \leftarrow LCO(M, M_{target}^{\alpha a});$$

$$v^{\alpha a} \leftarrow v^{\alpha a} + \Delta v^{\alpha a};$$

wherein $M_{target}{}^{\alpha a}$ represents the target magnetic moment; represents the constraint constant, $LCO(M, M_{target}{}^{\alpha a})$ represents the Lagrange coefficient optimization for M and $M_{target}{}^{\alpha a}$, and M represents the atomic magnetic moment;

step 335: outputting the constraint constant $v^{\alpha a}$ and the wave function $\psi$ at this point; the constraint constant and wave function at this point being the constraint constant and the wave function of the target magnetic configuration.

Optionally, the Hamiltonian in step 3 includes:

adding a linear energy contribution into the Hamiltonian, the linear energy contribution comprises the constraint constant and the difference between the target magnetic moment and the atomic magnetic moment, and a dimension of the constraint constant in the linear energy contribution is three times the number of atoms, and the atom has different constraint constants in different directions.

Optionally, the employing the self-consistent iteration to obtain the constraint constant and the wave function of the target magnetic configuration in the step 3, including:

an amount of variation introduced in a local field is proportional to the constraint constant in a process of the self-consistent iteration.

Optionally, a method of obtaining the energy, the temperature and the pressure of the magnetic material is:

obtaining a magnetic moment force based on the constraint constant, obtaining the energy of the magnetic material based on the wave function and the constraint constant, or obtaining the energy of the magnetic material based on the magnetic moment force; and obtaining the temperature and the pressure of the magnetic material based on the magnetic moment force, the magnetic moment, and the atomic configuration.

Optionally, using the phase transition temperature, the magnetic configuration and the atomic configuration of the magnetic material, and the energy, the temperature and the pressure of the magnetic material to train the deep learning model in the step 7 is:

taking the magnetic configuration and the atomic configuration of the magnetic material, and the energy, the temperature and the pressure of the magnetic material as an input and taking the phase transition temperature of the magnetic material as an output to train the deep learning model.

Optionally, the step 7 further comprises determining a synthesis process of an object based on the magnetic configuration and the phase transition temperature of the magnetic material.

A second aspect of the present disclosure proposes a simulation method for a magnetic configuration of a magnetic material, including:

step 310: obtaining an initial magnetic configuration and an initial atomic configuration;

step 320: setting a target magnetic configuration and a target atomic configuration, and obtaining a target magnetic moment based on the target magnetic configuration;

step 330: employing a self-consistent iteration to optimize an electron density and a constraint constant according to a Hamiltonian of the magnetic configuration, comprising:

step 331: initializing the constraint constant $v^{\alpha a}$ to 0 and obtaining a target magnetic moment based on the target magnetic configuration;

step 332: with the constraint constant $v^{\alpha a}$, using the Hamiltonian of the initial magnetic configuration to solve a KS equation to obtain a corresponding wave function $\psi$ as an electron density, determining the wave function $\psi$ according to the following equation:

$$\{H^{KS}+H^{v}\}|\psi_{n\sigma}\rangle = \epsilon_n|\psi_{n\sigma}\rangle;$$

wherein $H^{KS}$ represents the KS equation, $H^V$ represents the Hamiltonian of the magnetic system, $\psi_{n\sigma}$ represents a σ component of a spinon wave function, $\Sigma_n$ represents an eigenvalue, and n represents a $n^{th}$ electron energy level;

step 333: using a function $M(\Delta v^{\alpha a})$ to update a magnetic moment M of an atom based on the wave function $\psi$ and the constraint constant $v^{\alpha a}$, wherein, $$\Delta H^v(r) \leftarrow -\Delta v^{\alpha a} P_{\sigma\sigma'}{}^\alpha \Theta(r^{cut}-|r-r^a|);$$

$$\{H^{KS}+H^v+\Delta H^v\}|\psi_{n\sigma}\rangle = \epsilon_n |\psi_{n\sigma}\rangle$$

$$m^\alpha(r) \leftarrow f_n P_{\sigma\sigma'}{}^\alpha \omega_{n\sigma}(r)\psi_{n\sigma'}(r);$$

$$M^{\alpha a} \leftarrow \int d^3r m^\alpha(r) \Theta(r^{cut}-|r-r^a|);$$

wherein $H^V(r)$ represents the Hamiltonian of the magnetic system, $v^{\alpha a}$ represents the constraint constant, $P_{\sigma\sigma'}{}^\alpha$ represents a Pauli matrix in the α direction, θ(•) represents a cutoff function, $r^{cut}$ represents a cutoff radius, r represents a real space coordinate, $r^a$ represents a real space coordinate of an atom a, $M^{\alpha a}$ represents a magnetic moment of atom a in an α direction; $m^\alpha(r)$ represents a spin density in the α direction, $f_n$ represents an occupation number on an orbital, $\psi_{n\sigma}$ represents a σ component of the spinon wave function, $\psi_{n\sigma'}$ represents a σ' component of the spinon wave function; $d^3r$ represents a three-dimensional differential symbol;

step 334: determining whether a difference between the atomic magnetic moment and the target magnetic moment is greater than a preset threshold; if the difference is not greater than the present threshold, performing the step 335, and if the difference is greater than the present threshold, updating the constraint constant $v^{\alpha a}$ according to the following equation and returning to the step 332, and then using a new constraint constant:

$$LCO(M, M_{target}^{\alpha a}) \equiv \underset{\Delta v^{\alpha a}}{\operatorname{argmin}} \sum_{a\alpha} (M^{\alpha a} - M_{target}^{\alpha a})^2$$

$$\Delta v^{\alpha a} \leftarrow LCO(M, M_{target}^{\alpha a});$$

$$v^{\alpha a} \leftarrow v^{\alpha a} + \Delta v^{\alpha a};$$

wherein $M_{target}{}^{\alpha a}$ represents the target magnetic moment; $v^{\alpha a}$ represents the constraint constant, $LCO(M, M_{target}{}^{\alpha a})$ represents the Lagrange coefficient optimization for M and $M_{target}{}^{\alpha a}$, and M represents the atomic magnetic moment;

step 335: outputting the constraint constant $v^{\alpha a}$ and the wave function $\psi$ at this point; the constraint constant and wave function at this point being the constraint constant and the wave function of the target magnetic configuration;

step 340: simulating the magnetic configuration of the magnetic material:

determining spatial positions of all constrained atoms corresponding to the magnetic configuration, a final-state magnetic moment for each atom, a magnetic interaction force and a full-degree-of-freedom constraint field as experienced by each atom, based on the constraint constant and the wave function, to achieve the simulation of the target magnetic configuration.

Optionally, the initial magnetic configuration is under an absolute zero temperature, a zero pressure, and a zero magnetic field.

Optionally, the step 310 comprises:
obtaining a magnetic moment based on the initial magnetic configuration, and obtaining a position of each of the atoms in the initial magnetic configuration based on the initial atomic configuration.

Optionally, in the step 330, optimizing the electron density and the constraint constant based on the Hamiltonian of the magnetic configuration includes:
adding a linear energy contribution into the Hamiltonian, the linear energy contribution includes the constraint constant and the difference between the target magnetic moment and the atomic magnetic moment, and a dimension of the constraint constant in the linear energy contribution is three times the number of atoms, and the atom has different constraint constants in different directions.

Optionally, in the step 330, optimizing the electron density and the constraint constant based on the Hamiltonian of the magnetic configuration includes:
fixing a spatial position of at least one atom in the initial magnetic material or fixing a magnetic moment of at least one atom in the initial magnetic material to obtain a relaxation process of the magnetic moment of the remaining atoms.

Optionally, determining a synthesis process of an object based on the magnetic configuration of the magnetic material after the magnetic configuration of the magnetic material is simulated.

The technical solution provided by the present disclosure can bring about following advantages:

1) The present disclosure forms the magnetic configuration library, and through the analysis and study of existing magnetic materials, the library can be used to guide the development of the target magnetic material.

2) Based on the obtained initial magnetic configuration and the atomic configuration, the present disclosure can obtain the target magnetic configuration based on the constraint, enabling the simulation of the target magnetic configuration.

3) The present disclosure is applicable to the atomic magnetic moment under nonlinear representation, which has high constraint precision and can improve the calculation accuracy of the atomic magnetic moment to $10^{-8}$ uB and the calculation accuracy of magnetic energy to $10^{-9}$ eV.

4) The present disclosure has a wide range of applicability, requiring only a small amount of testing for different magnetic materials to complete the constraints, and most parameters are adaptive during the constraint process, therefore, it can effectively converge even for magnetic excited states with high energy.

5) In addition to the conventional first principle calculation outputs, for example the final state magnetic moment and the corresponding system energy, the present disclosure can also provide a constraint field with full degrees of freedom corresponding to the magnetic configuration.

6) The present disclosure can selectively constrain some atoms or components of the magnetic moment, for studying the relaxation process of other atomic magnetic moments while fixing some atomic magnetic moments.

Additional aspects and benefits of the present disclosure will be partially provided in the following description, some of which will become apparent, or will be learned through the implementation of the present disclosure.

BRIEF DESCRIPTION OF THE DRAWINGS

The foregoing and/or additional aspects and advantages of the present disclosure will become apparent and readily understood from the following description of embodiments in conjunction with the accompanying drawings, wherein.

DETAILED DESCRIPTION

Embodiments of the present disclosure are described in detail below, and examples of said embodiments are shown in the accompanying drawings, wherein the same or similar sign denotes the same or similar elements or elements having the same or similar functions. The embodiments described below with reference to the accompanying drawings are exemplary and are provided for the purpose of explaining the present disclosure, and should not be construed as limiting the present disclosure. Rather, the embodiments of the present disclosure include all variations, modifications, and equivalents that fall within the spirit and scope of the appended claims.

The present disclosure is described in detail below in connection with specific embodiments.

Figure 1:
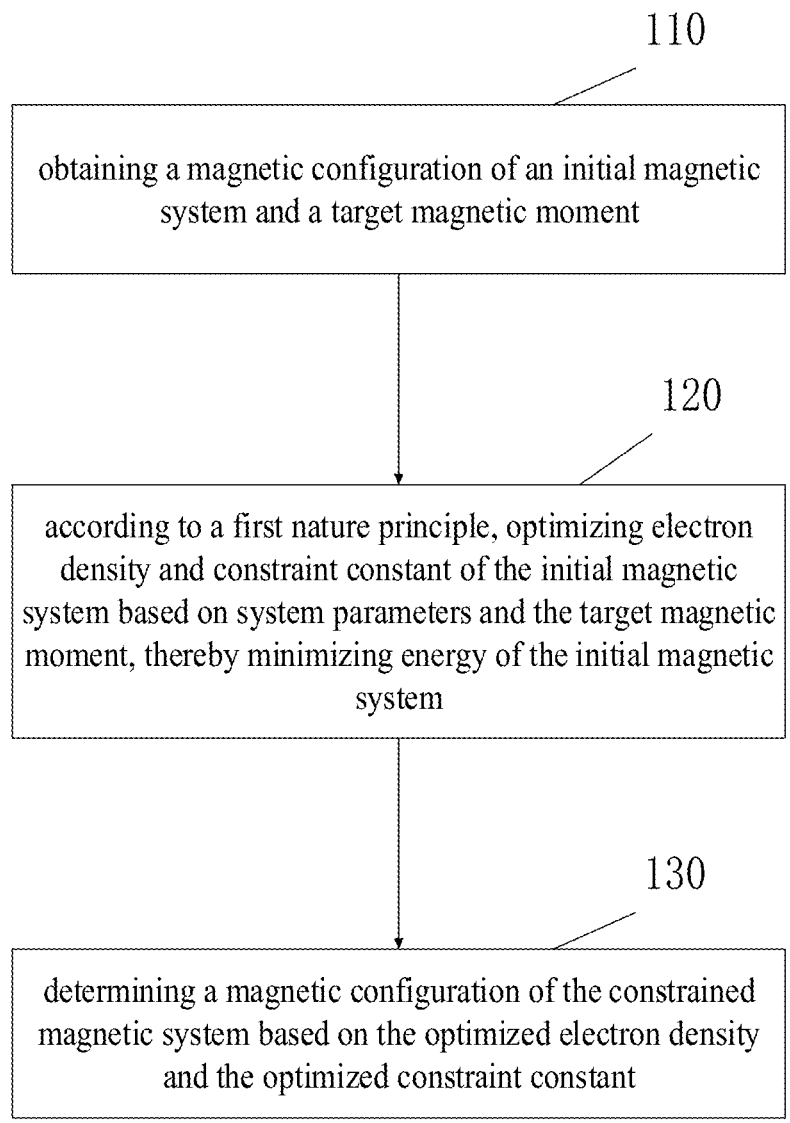
FIG. 1 shows a flowchart of a first principle magnetic restraint method according to an embodiment of the present disclosure.

FIG. 1 shows a flowchart of a first principle magnetic restraint method according to an embodiment of the present disclosure.

As shown in FIG. 1, the first principle magnetic restraint method according to the embodiment of the present disclosure includes following steps of:

step 110: obtaining a magnetic configuration of an initial magnetic material and a target magnetic moment;

step 120: according to a first principle, optimizing electron density and constraint constant of the initial magnetic material based on system parameters and the target magnetic moment, thereby minimizing energy of the initial magnetic material;

step 130: determining a magnetic configuration of the constrained magnetic material based on the optimized electron density and the optimized constraint constant.

In the embodiment of the present disclosure, obtaining the magnetic configuration of the initial magnetic material includes:

obtaining spatial positions of all atoms corresponding to the magnetic configuration of the initial magnetic material, and magnetic moment of each atom.

In the embodiment of the present disclosure, optimizing electron density and constraint constant of the initial magnetic material based on system parameters and the target magnetic moment, including:

optimizing the electron density and the constraint constant based on a self-consistent iteration;

a variation amount introduced in a local field is proportional to the constraint constant in a process of the self-consistent iteration.

In the embodiment of the present disclosure, the optimizing the electron density and the constraint constant based on the self-consistent iteration, including:

keeping the constraint constant during the optimization of the electron density;

keeping the electron density constant during the optimization of the constraint constant.

According to some embodiments, the optimizing the electron density and the constraint constant includes:

step 210: initializing the constraint constant $v^{\alpha a}$ to 0 and determining the target magnetic moment;

step 220: solving a KS (Kohn-Sham) equation by using the Hamiltonian of the initial configuration to obtain a wave function ψ, as expressed by the following equation:

$$\{H^{KS}+H^{V}\}|\psi_{n\sigma}\rangle = \epsilon_{n}|\psi_{n\sigma}\rangle;$$

wherein $H^{KS}$ represents the KS equation, $H^{V}$ represents the Hamiltonian of the magnetic system, $\psi_{n\sigma}$ represents the wave function, and $\epsilon_{n}$ represents an eigenvalue.

step 230: using a function $M(\Delta v^{\alpha a})$ to update a magnetic moment M of an atom based on the wave function ψ and the constraint constant $v^{\alpha a}$, the function $M(\Delta v^{\alpha a})$ is determined by a following formula:

$$\Delta H^{V}(r) \leftarrow -\Delta v^{\alpha a} P_{\sigma\sigma'}^{\alpha}\Theta(r^{cut}-|r-r^{a}|);$$

$$\{H^{KS}+H^{V}+\Delta H^{V}\}|\psi_{n\sigma}\rangle = \epsilon_{n}|\psi_{n\sigma}\rangle$$

$$m^{\alpha}(r) \leftarrow f_{n}P_{\sigma\sigma'}^{\alpha}\omega_{n\sigma}(r)\psi_{n\sigma}(r);$$

$$M^{\alpha a} \leftarrow \int d^{3}r m^{\alpha}(r)\Theta(r^{cut}-|r-r^{a}|);$$

wherein $H^{V}(r)$ represents the Hamiltonian of the magnetic system, $v^{\alpha a}$ represents the constraint constant, $P_{\sigma\sigma'}^{\alpha}$ represents a Pauli matrix in the α direction, θ(•) represents a cutoff function, $r^{cut}$ represents a cutoff radius, r represents a real space coordinate, $r^{a}$ represents a real space coordinate of an atom a, $M^{\alpha a}$ represents a magnetic moment of atom a in an α direction; $m^{\alpha}(r)$ represents a spin density in the α direction, $f_{n}$ represents an occupation number on an orbital, $\psi_{n\sigma}$ represents a σ component of the spinon wave function, $\psi_{n\sigma'}$ represents a σ' component of the spinon wave function; $d^{3}r$ represents a three-dimensional differential symbol;

step 240: determining whether a difference between the atomic magnetic moment and the target magnetic moment is greater than a preset threshold; if the difference is not greater than a preset threshold, the atomic magnetic motion and the constraint constant may be outputted; if the difference is greater than the preset threshold, the constraint constant $v^{\alpha a}$ is updated by using the formula and the step 220 is repeated:

$$LCO(M, M_{target}^{\alpha a}) \equiv \underset{\Delta v^{\alpha a}}{\mathrm{argmin}}\sum_{a\alpha}(M^{\alpha a}-M_{target}^{\alpha a})^{2}$$

$$\Delta v^{\rho a} \leftarrow LCO(M, M_{target}^{\alpha a});$$

$$v^{\rho a} \leftarrow v^{\rho a} + \Delta v^{\rho a};$$

wherein $M_{target}^{\alpha a}$ represents the target magnetic moment; $v^{\alpha a}$ represents the constraint constant, $LCO(M, M_{target}^{\alpha a})$ represents the Lagrange coefficient optimization for M and $M_{target}^{\alpha a}$, and M represents the atomic magnetic moment.

In the embodiment of the present disclosure, optimizing the electron density and the constraint constant of the initial magnetic material based on the system parameters and the target magnetic moment, includes:

in the process of optimizing the electron density and the constraint constant, adding a linear energy contribution into the Hamiltonian, the linear energy contribution comprises the constraint constant and the difference between the target magnetic moment and the atomic magnetic moment.

In some embodiments, the Hamiltonian is a direct expression of the system's interactions, derived by reapplying a variational method to the energy functional with a magnetic penalty term, and first obtained in the first principle density functional theory (DFT).

In some embodiments, the system energy of the magnetic material is obtained indirectly in DFT, and can be calculated by employing Harris-Foulkes generalized function. During the calculation process, it is necessary to calculate repeated calculation terms (double-counting) and the like.

In the embodiment of the present disclosure, adding the linear energy contribution to the Hamiltonian during the optimization of the electron density and the constraint constants, includes:

a dimension of the constraint constant in the linear energy contribution is three times the number of atoms, and the atom has different constraint constants in different directions.

In the embodiment of the present disclosure, optimizing the electron density and the constraint constant of the initial magnetic material based on the system parameters and the target magnetic moment, includes:

In the process of optimizing the electron density and the constraint constant of the initial magnetic material, fixing a spatial position of at least one atom in the initial magnetic material or fixing a magnetic moment of at least one atom in the initial magnetic material to obtain a relaxation process of the magnetic moment of the remaining atoms.

In the embodiment of the present disclosure, determining the magnetic configuration of the constrained magnetic material based on the optimized electron density and the optimized constraint constant includes:

based on the optimized electron density and the optimized constraint constant, determining spatial positions of all constrained atoms corresponding to the magnetic configuration of the constrained magnetic material, a final-state magnetic moment for each atom, a magnetic interaction force and a full-degree-of-freedom constraint field as experienced by each atom, based on the constraint constant and the wave function, to achieve the simulation of the target magnetic configuration.

In some embodiments, the magnetic interaction force to which each atom is subjected may be obtained by two following methods:

a first method, which is obtained by differentiating the system energy of the magnetic material with respect to the magnetic moment, is based on the following equation:

$$\frac{dE_\lambda}{d\lambda} = \frac{\partial E[\psi_\lambda, \lambda]}{\partial \lambda} + \int \frac{\delta E[\psi, \lambda]}{\delta \psi(x)} \frac{d\psi_\lambda(x)}{d\lambda} dx = \frac{\partial E[\psi_\lambda, \lambda]}{\partial \lambda}$$

wherein $E_\lambda$ represents the system energy, $\lambda$ represents the constraint constant, and $\psi_\lambda$ represents the wave function in the system under the constraint.

A second method, which is obtained by the magnetic interaction force on each atom, i.e., the constraint constant for each atom, is based on the following equation:

$$\frac{dE_{M_{target}^{\alpha\alpha}}}{dM_{target}^{\alpha\alpha}} = \frac{\partial \left( E^{KS}[\rho] - \sum_{a\alpha} v^{a\alpha} \left( M^{a\alpha}[\rho] - M_{target}^{a\alpha} \right) \right)}{\partial M_{target}^{a\alpha}} = v^{a\alpha}$$

wherein $M_{target}^{\alpha\alpha}$ represents the target magnetic moment, the $E_{M_{target}^{\alpha\alpha}}$ represents the energy of the system when the magnetic moment is constrained in the a-atom $\alpha$ direction, $E^{KS}[\rho]$ represents the energy of the system solved by the KS equation when the electron density is $\rho$, $M_{\alpha\alpha}[\rho]$ represents the magnetic moment of the atom $\rho$ in the initial magnetic material, and $v^{\alpha\alpha}$ represents the constraint constant.

In the embodiment of the present disclosure, after determining the magnetic configuration of the constrained magnetic material based on the optimized electron density and the optimized constraint constant, further including:

performing high-throughput calculation on the spatial positions of all constrained atoms, the system energy of the constrained magnetic material, the atomic forces experienced by each atom, and the magnetic interaction forces experienced by each atom to obtain a machine learning dataset.

In some embodiments, the high-throughput calculation refers to the process of sampling a large number of atomic positions and target magnetic moments within a certain space to form a large batch of inputs, using modern computing clusters and task distribution systems to quickly deploy calculations, and obtaining a large batch of outputs including energy, atomic forces, and magnetic interactions.

In some embodiments, the machine learning dataset acquired during the high-throughput calculation includes the spatial locations of the atoms, the magnetic moment of the atoms, the system energy of the magnetic material, the atomic forces experienced by each atom, and the magnetic interaction forces experienced by each atom.

In some embodiments, the method proposed in the embodiment of the present disclosure may be integrated with the commonly used plane wave DFT software VASP by applying patches to its source code and compiling it in the same manner. Moreover, it is equipped with the corresponding arithmetic examples and setting templates, which are easy to use, with parameter settings fully compatible with the VASP and without interfering with any of the original functions of the VASP.

Figure 2:
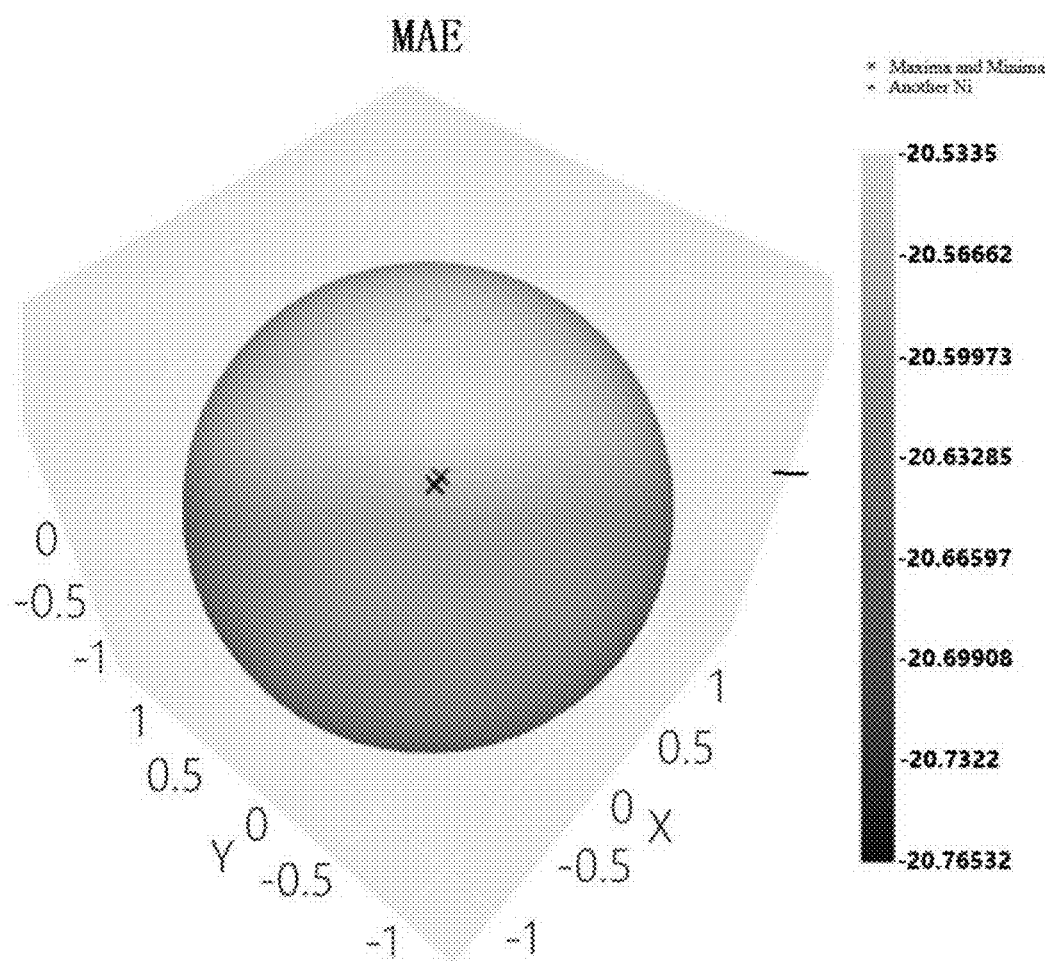
FIG. 2 is a schematic view of distributing energy in a material NiO along a magnetization direction of the first Ni atom according to the embodiment of the present disclosure.
Figure 3:
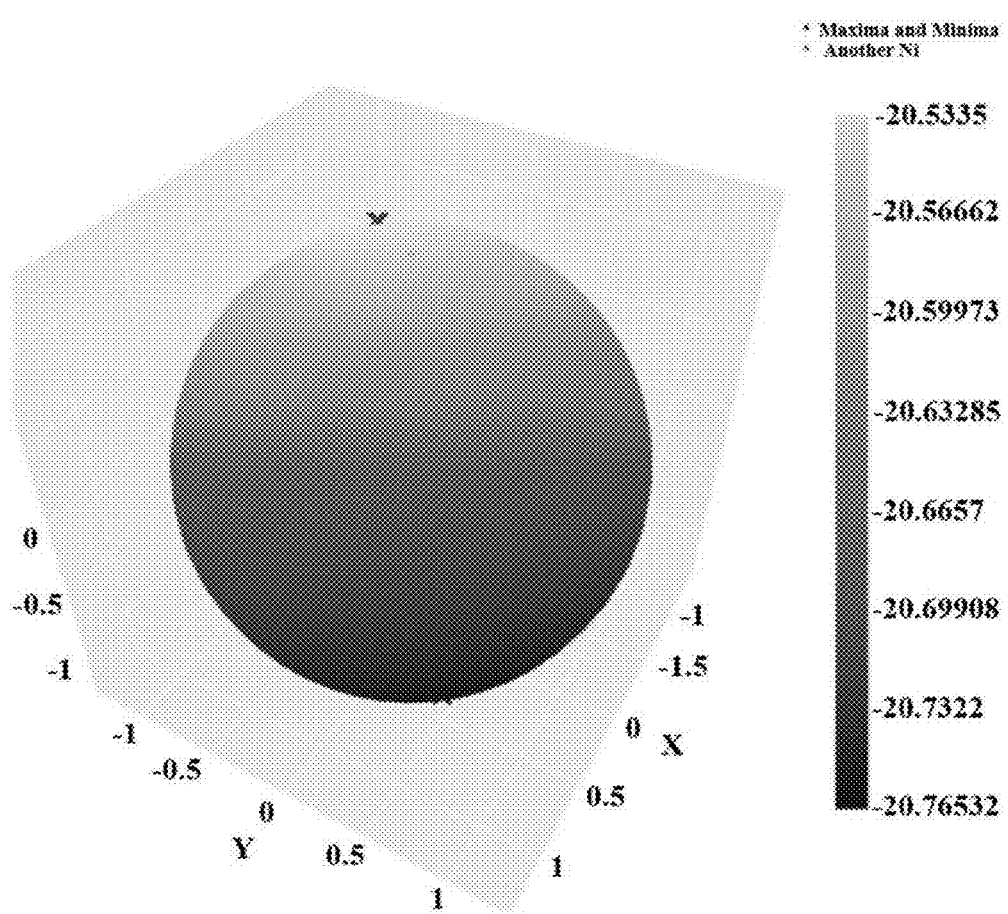
FIG. 3 is a schematic view of distributing the energy in the material NiO along a magnetization direction of the second Ni atom according to the embodiment of the present disclosure.

As an example of a scenario, the method proposed by the embodiment of the present disclosure is employed to calculate the energy distribution in the material NiO along the magnetization directions of two Ni atoms, as shown in FIGS. 2 and 3, darker colors represent low energy while lighter colors represent high energy. It can be seen that the method provided by the embodiment of the present disclosure has a high constraint accuracy.

As above described, the method proposed by the embodiment of the present disclosure is used to obtain the initial magnetic configuration and the target magnetic moment of the magnetic material; to optimize the electron density and the constraint constant of the initial magnetic material according to the system parameters and the target magnetic moment based on the first principle, thereby minimizing the energy of the initial magnetic material; and to determine the magnetic configuration of the constrained magnetic material based on the optimized electron density and optimized constraint constant. Therefore, it can be applied to the atomic magnetic moment under nonlinear representation; it has high constraint precision, capable of improving the calculation accuracy of the atomic magnetic moment to $10^{-8}$ uB and the calculation accuracy of magnetic energy to $10^{-9}$ eV; it has a wide range of applicability, requiring only a small amount of testing for different magnetic materials to complete the constraints, and most parameters are adaptive during the constraint process, therefore, it can effectively converge even for magnetic excited states with high energy; in addition to conventional first principle calculation outputs, such as final state magnetic moment and the corresponding energy, it can also provide a constraint field with full degrees of freedom corresponding to the magnetic configuration; it can selectively constrain certain atoms or components of the magnetic moment, for studying the relaxation process of other atomic magnetic moments while fixing certain atomic magnetic moments.

To achieve the above embodiments, the present disclosure also proposes a first principle magnetic constraint device.

Figure 4:
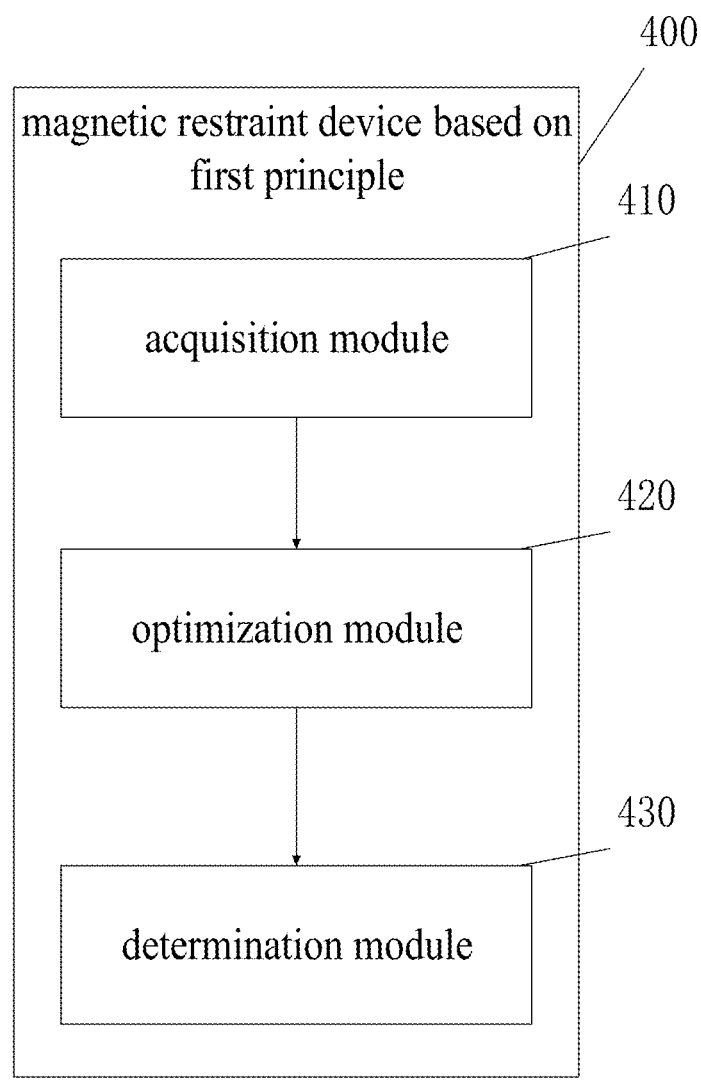
FIG. 4 shows a schematic structural view of a first principle magnetic constraint device according to the embodiment of the present disclosure.

FIG. 4 shows a schematic structural view of a first principle magnetic constraint device according to the embodiment of the present disclosure.

As shown in FIG. 4, the first principle magnetic constraint device 400 includes:
- an acquisition module 410 for acquiring a magnetic configuration and a target magnetic moment of an initial magnetic material;
- an optimization module 420 for optimizing an electron density and a constraint constant of the initial magnetic material based on system parameters and a target magnetic moment based on a first principle, thereby minimizing energy of the initial magnetic material;
- a determination module 430 for determining a magnetic configuration of the constrained magnetic material based on the optimized electron density and the optimized constraint constant.

The device proposed in the embodiment of the present disclosure can have high constraint accuracy and significantly improve the constraint effect of the magnetic material by obtaining the initial magnetic configuration and the target magnetic moment of the magnetic material; optimizing the electron density and the constraint constant of the initial magnetic material according to the system parameters and the target magnetic moment based on the first principle, thereby minimizing the energy of the initial magnetic material; and determining the magnetic configuration of the constrained magnetic material based on the optimized electron density and optimized constraint constant.

Figure 5:
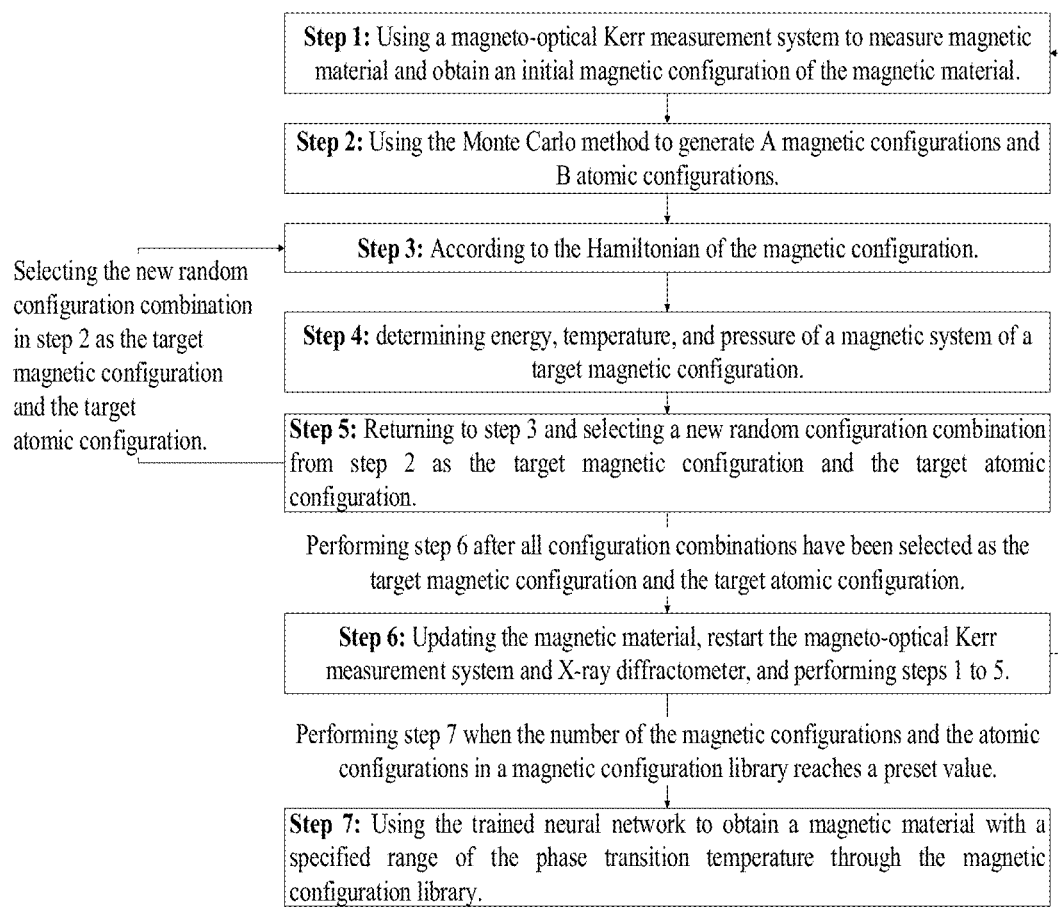
FIG. 5 shows a flowchart of a generation method for a magnetic configuration of a magnetic material according to the embodiment of the present disclosure.

The present disclosure also proposes a generation method for a magnetic configuration of a magnetic material, the method shown in FIG. 5 includes:

Step 1: using a magneto-optical Kerr measurement system (MOKE) to measure magnetic material and obtain an initial magnetic configuration of the magnetic material, turning off the magneto-optical Kerr measurement system, and then obtaining an initial atomic configuration by diffracting the magnetic material using X-rays, and turning off the X-rays;

wherein one magnetic material may acquire a plurality of initial magnetic configurations and initial atomic configurations, a magnetic moment may be obtained according to the magnetic configuration, and a position of each atom in the magnetic configuration may be obtained according to the atomic configuration;

step 2: for each of the initial magnetic configurations and the initial atomic configurations, randomly generating A random magnetic configurations and B random atomic configurations, thereby creating A×B random configuration combinations; wherein both A and B are positive integers;

wherein values of A and B may be the same or different; a range of values for A and B is [10, 50], the magnetic material may include a plurality of magnetic configurations, and each of the magnetic configurations corresponds to a plurality of atomic configurations. When randomly generated, the Monte Carlo method is preferably used;

step 3: selecting a randomized configuration combination in the step 2 as the target magnetic configuration and the target atomic configuration, and based on the first principle and according to the Hamiltonian of the magnetic configuration, using a self-consistent iteration to obtain the constraint constant and the wave function of the target magnetic configuration; including following steps:

step 331: initializing the constraint constant $v^{\alpha a}$ to 0 and calculating the target magnetic moment according to the target magnetic configuration;

step 332: with the constraint constant $v^{\alpha a}$, using the Hamiltonian of the initial magnetic configuration to solve a KS equation to obtain a corresponding wave function $\psi$ as an electron density, determining the wave function $\psi$ according to the following equation:

$$\{H^{KS}+H^v\}|\psi_{n\sigma}\rangle = \epsilon_n|\psi_{n\sigma}\rangle;$$

wherein $H^{KS}$ represents the KS equation, $H^V$ represents the Hamiltonian of the magnetic system, $\psi_{n\sigma}$ represents a σ component of a spinon wave function, $\epsilon_n$ represents an eigenvalue, and n represents a $n^{th}$ electron energy level;

step 333: using a function $M(\Delta v^{\alpha a})$ to update a magnetic moment M of an atom based on the wave function $\psi$ and the constraint constant $v^{\alpha a}$, wherein, the function $M(\Delta v^{\alpha a})$ is determined by a following formula:

$$\Delta H^v(r) \leftarrow -\Delta v^{\alpha a} P_{\sigma\sigma'}^{\alpha}\Theta(r^{cut}-|r-r^a|);$$

$$\{H^{KS}+H^v+\Delta H^v\}|\psi_{n\sigma}\rangle = \epsilon_n|\psi_{n\sigma}\rangle$$

$$m^{\alpha}(r) \leftarrow f_n P_{\sigma\sigma'}^{\alpha}\omega_{n\sigma}(r)\psi_{n\sigma'}(r);$$

$$M^{\alpha a} \leftarrow \int d^3r\, m^{\alpha}(r)\Theta(r^{cut}-|r-r^a|);$$

wherein $H^V(r)$ represents the Hamiltonian of the magnetic system, $v^{\alpha a}$ represents the constraint constant $P_{\sigma\sigma'}^{\alpha}$ represents a Pauli matrix in the α direction, θ(•) represents a cutoff function, $r^{cut}$ represents a cutoff radius, r represents a real space coordinate, $r^a$ represents a real space coordinate of an atom a, $M^{\alpha a}$ represents a magnetic moment of atom α in an α direction; $m^{\alpha}(r)$ represents a spin density in the α direction, $f_n$ represents an occupation number on an orbital, $\psi_{n\sigma}$ represents a σ component of the spinon wave function, $\psi_{n\sigma'}$ represents a σ' component of the spinon wave function; $d^3r$ represents a three-dimensional differential symbol;

step 334: determining whether a difference between the atomic magnetic moment and the target magnetic moment is greater than a preset threshold; if the difference is not greater than the present threshold, performing the step 335, and if the difference is greater than the present threshold, updating the constraint constant $v^{\alpha a}$ according to the following equation and returning to the step 332, and then using a new constraint constant:

$$LCO(M, M_{target}^{\alpha a}) \equiv \underset{\Delta v^{\rho a}}{\mathrm{argmin}} \sum_{a\alpha}(M^{\alpha a}-M_{target}^{\alpha a})^2$$

$$\Delta v^{\rho a} \leftarrow LCO(M, M_{target}^{\alpha a});$$

$$v^{\rho a} \leftarrow v^{\rho a}+\Delta v^{\rho a};$$

wherein $M_{target}^{\alpha a}$ represents the target magnetic moment; $v^{\alpha a}$ represents the constraint constant, $LCO(M, M_{target}^{\alpha a})$ represents the Lagrange coefficient optimization for M and $M_{target}^{\alpha a}$, and M represents the atomic magnetic moment. In a preferable embodiment, the threshold value may be set to $10^{-4}$ Bohr magneton.

In the above calculation, a linear energy contribution is added to the Hamiltonian. The linear energy contribution includes the constraint constant and a difference between the target magnetic moment and the magnetic moment of the atom. A dimension of the constraint constant in the linear energy contribution is three times the number of the atoms, each of the atoms has different constraint constants in different directions. The amount of variation introduced in a local field is proportional to the constraint constant.

step 335: outputting the constraint constant $v^{\alpha a}$ and the wave function $\psi$ at this point; the constraint constant and wave function at this point being the constraint constant and the wave function of the target magnetic configuration;

step 4: based on the target magnetic configuration, the target atomic configuration, the constraint constant and the wavefunction of the target magnetic configuration, determining energy, temperature, and pressure of the target magnetic configuration, and storing the target atomic configuration, the target magnetic configuration, the constraint constant and the wave function of the target atomic configuration, the energy, the temperature, and the pressure of the magnetic material in a magnetic configuration library;

It should be noted that the temperature and pressure referred to here are the temperature and pressure at which the target magnetic configuration can exist.

A magnetic moment force is obtained based on the constraint constant and is also known as a magnetic interaction force experienced by the atom; the energy of the magnetic material is obtained based on the wave function and the constraint constant, or the energy of the magnetic material is obtained based on the magnetic moment force; the temperature and the pressure are obtained based on the magnetic moment force, the magnetic moment and the atomic configuration;

step 5: returning to step 3, selecting a new random configuration combination from step 2 as the target magnetic configuration and the target atomic configuration, and performing step 6 until all of the random combinations are selected as the target magnetic configuration and the target atomic configuration. The new random configuration combination is defined as a random configuration combination that has not been used in the step 3;

step 6: updating the magnetic material, and then restarting the magneto-optical Kerr measurement system and the X-ray diffractometer, and performing steps 1 to 5, and performing step 7 when the number of the magnetic configuration and the atomic configuration in the magnetic confirmation library reaches a preset value. In a preferable implementation, the preset value may be 2000;

step 7: using a superconducting quantum interference device (i.e., SQUID) to measure a magnetic material to obtain a phase transition temperature, and using the phase transition temperature of the magnetic material, the magnetic configuration, the atomic configuration, and the energy, the temperature and the pressure of the magnetic material to train a deep learning model, and then using the trained deep learning model to obtain the magnetic material in a specified range of the phase transition temperature through the magnetic configuration database. Subsequently, the synthesis process may be determined based on the magnetic configuration of the magnetic material and the phase transition temperature range. In a preferred embodiment, the specified phase transition temperature range may be, for example, 600-700° C.

Training the deep learning model is described as taking the magnetic configuration and the atomic configuration of the magnetic material, and the energy, the temperature and the pressure of the magnetic material as an input and taking the phase transition temperature of the magnetic material as an output to train the deep learning model.

According to another aspect of the present disclosure, a simulation method for a magnetic configuration of a magnetic material is proposed, including:

step 310: obtaining an initial magnetic configuration and an initial atomic configuration;

the initial magnetic configuration is in an ideal state environment of absolute 0 degrees, 0 pressure, 0 magnetic field. The magnetic moment may be obtained based on the magnetic configuration, and the position of each atom in the magnetic configuration may be obtained based on the atomic configuration;

step 320: setting a target magnetic configuration and a target atomic configuration, and obtaining a target magnetic moment based on the target magnetic configuration;

step 330: employing a self-consistent iteration to optimize an electron density and a constraint constant according to a Hamiltonian of the magnetic configuration, including:

step 331: initializing the constraint constant $v^{\alpha a}$ to 0 and obtaining a target magnetic moment based on the target magnetic configuration;

step 332: with the constraint constant $v^{\alpha a}$, using the Hamiltonian of the initial magnetic configuration to solve a KS equation to obtain a corresponding wave function $\psi$ as an electron density, determining the wave function $\psi$ according to the following equation:

$$\{H^{KS}+H^v\}|\psi_{n\sigma}\rangle = \epsilon_n|\psi_{n\sigma}\rangle;$$

wherein $H^{KS}$ represents the KS equation, $H^V$ represents the Hamiltonian of the magnetic system, $\psi_{n\sigma}$ represents a $\sigma$ component of a spinon wave function, $\epsilon_n$ represents an eigenvalue, and n represents a $n^{th}$ electron energy level;

step 333: using a function $M(\Delta v^{\alpha a})$ to update a magnetic moment M of an atom based on the wave function $\psi$ and the constraint constant $v^{\alpha a}$, wherein, the function $M(\Delta v^{\alpha a})$ is determined according to the following equation:

$$\Delta H^v(r) \leftarrow -\Delta v^{\alpha a} P_{\sigma\sigma}{}^\alpha \Theta(r^{cut} - |r - r^a|);$$

$$\{H^{KS} + H^v + \Delta H^v\}|\psi_{n\sigma}\rangle = \epsilon_n |\psi_{n\sigma}\rangle$$

$$m^\alpha(r) \leftarrow f_n P_{\sigma\sigma}{}^\alpha \omega_{n\sigma}(r)\psi_{n\sigma}(r);$$

$$M^{\alpha a} \leftarrow \int d^3 r m^\alpha(r) \Theta(r^{cut} - |r - r^a|);$$

wherein $H^V(r)$ represents the Hamiltonian of the magnetic system, $v^{\alpha a}$ represents the constraint constant, $P_{\sigma\sigma}{}^\alpha$ represents a Pauli matrix in the $\alpha$ direction, $\theta(\cdot)$ represents a cutoff function, $r^{cut}$ represents a cutoff radius, r represents a real space coordinate, $r^a$ represents a real space coordinate of an atom a, $M^{\alpha a}$ represents a magnetic moment of atom $\alpha$ in an $\alpha$ direction; $m^\alpha(r)$ represents a spin density in the $\alpha$ direction, $f_n$ represents an occupation number on an orbital, $\psi_{n\sigma}$ represents a $\sigma$ component of the spinon wave function, $\psi_{n\sigma}'$ represents a $\sigma'$ component of the spinon wave function; $d^3r$ represents a three-dimensional differential symbol;

step 334: determining whether a difference between the atomic magnetic moment and the target magnetic moment is greater than a preset threshold; if the difference is not greater than the present threshold, performing the step 335, and if the difference is greater than the present threshold, updating the constraint constant $v^{\alpha a}$ according to the following equation and returning to the step 332, and then using a new constraint constant:

$$LCO(M, M_{target}^{\alpha a}) \equiv \underset{\Delta v^{\beta a}}{\operatorname{argmin}} \sum_{a\alpha} (M^{\alpha a} - M_{target}^{\alpha a})^2$$

$$\Delta v^{\beta a} \leftarrow LCO(M, M_{target}^{\alpha a});$$

$$v^{\beta a} \leftarrow v^{\beta a} + \Delta v^{\beta a};$$

wherein $M_{target}^{\alpha a}$ represents the target magnetic moment; $v^{\alpha a}$ represents the constraint constant, $LCO(M, M_{target}^{\alpha a})$ represents the Lagrange coefficient optimization for M and $M_{target}^{\alpha a}$, and M represents the atomic magnetic moment;

Preferably, a linear energy contribution is added to the Hamiltonian, said linear energy contribution including the constraint constant and the difference between the target magnetic moment and the atomic magnetic moment, and the dimension of the constraint constant is three times the number of the atoms. Each of the atoms has different constraint constants in different directions. By fixing the spatial position of at least one atom in the initial magnetic configuration, or fixing the magnetic moment of at least one atom in the initial magnetic configuration, the relaxation process of the magnetic moments of the remaining atoms can be obtained, where the remaining atoms refer to the atoms in the initial magnetic configuration other than the fixed atoms.

step 335: outputting the constraint constant $v^{\alpha a}$ and the wave function $\psi$ at this point; the constraint constant and wave function at this point being the constraint constant and the wave function of the target magnetic configuration;

step 340: simulating the magnetic configuration of the magnetic material:

determining spatial positions of all constrained atoms corresponding to the magnetic configuration, a final-state magnetic moment for each atom, a magnetic interaction force and a full-degree-of-freedom constraint field as experienced by each atom, based on the constraint constant and the wave function, to achieve the simulation of the target magnetic configuration.

The present disclosure employs the self-consistent iteration to optimize the electron density and the constraint constant, treating the size and direction of the atomic magnetic moment as free variables, and adaptively adjusting the constraint parameters to achieve efficient and accurate calculation of the energy and the wave function. The self-consistent iteration can provide information about spin-lattice interactions, which can facilitate guiding the preparation of material's magnetic excited states. Furthermore, it can also be used to calculate the electronic structure of specific magnetic excited states or spin fluctuation configurations, including effects on band structure, Fermi surface orbital characteristics, and topological characteristics. This can be utilized for studying fundamental physical issues such as spin and electron interactions, guiding the design of dynamic or optical properties with rich functionality.

By utilizing the method proposed by the present invention, the energy pathway and dynamic behavior of the antiferromagnetic (AFM) to ferromagnetic (FM) phase transition in a bulk NiO under a uniform external field were studied. It was found that the Ni atomic magnetic moments simultaneously exhibit a dynamic tendency to rotate tangentially to the field direction and to stretch radially along the field direction. Additionally, it was discovered that the potential barrier for the phase transition in periodically restricted single-crystal NiO is significantly higher, indicating the magnetic domain mechanism in the actual transition process. In the spin-lattice dynamics potential function model based on deep learning, the magnetic configurations generated by this method are used as the high-throughput self-consistent dataset generation end, which can greatly improve the training speed. The use of the spin-lattice dynamics potential function model based on deep learning for energy prediction of the magnetic excited state of NiO shows that the model has high prediction accuracy, can simulate the spin-lattice dynamics of large-scale systems, and has good extrapolation capabilities.

It should be understood that each part of this application can be implemented using hardware, software, firmware, or a combination thereof. In particular, the data of this application can be obtained using various devices, and the magnetic configurations obtained by the methods of this application can not only be used with various instruments to study existing magnetic materials but also guide the synthesis of new magnetic materials with better phase transition temperatures in fields such as magnetic materials for electric vehicle engines, magnetic materials for robot motors, and magnetic materials for computer hard drives.

Moreover, in the aforementioned embodiments, multiple steps or methods can be implemented using software or firmware stored in a memory and executed by a suitable instruction execution system. For example, if implemented in hardware, as in another embodiment, any one or a combination of the following well-known techniques can be used: discrete logic circuits with logic gate circuits for implementing logical functions on data signals, application-specific integrated circuits (ASICs) with appropriate combinational logic circuits, programmable gate arrays (PGAs), field-programmable gate arrays (FPGAs), etc.

A person of ordinary skill in the art may understand that all or some of the steps carried out to realize the method of the above embodiments are possible to be accomplished by instructing the relevant hardware through a program, and said program may be stored in a computer-readable storage medium which, when executed, includes one of the steps of the method embodiments or a combination thereof.

Furthermore, the functional units in the various embodiments of the present disclosure may be integrated in a processing module, or the individual units may be physically present separately, or two or more units may be integrated in a single module. Said integrated modules may be implemented either in the form of hardware or in the form of software functional modules. Said integrated module may also be stored in a computer-readable storage medium if it is realized in the form of a software function module and sold or used as a separate product.

The storage medium referred to above may be a read-only memory, a disk or a CD-ROM, for example.

Any process or method description depicted in the flowchart or otherwise described herein may be understood to represent a module, fragment, or portion of code comprising one or more executable instructions for implementing the steps of a particular logical function or process, and the scope of the preferred embodiments of the present disclosure includes additional implementations, which may be implemented not in the order shown or discussed, including according to the functions involved in a substantially simultaneous manner or in reverse order, to perform the functions, as should be understood by those skilled in the art to which the embodiments of the present disclosure belong.

In the description of the present specification, reference is made to the terms "an embodiment", "some embodiments", "example", "specific example", or "a specific example", "some examples", "exemplary", "specific examples", or "some examples", etc., means that a specific feature, structure, material, or characteristic described in conjunction with the embodiment or example is included in at least one embodiment or example of the present disclosure. In this specification, schematic expressions of the above terms do not necessarily refer to the same embodiment or example. Moreover, the specific features, structures, materials, or characteristics described may be combined in any one or more of the embodiments or examples in a suitable manner.

Although embodiments of the present disclosure have been shown and described above, it is to be understood that the above embodiments are exemplary and are not to be construed as limiting the present disclosure, and that changes, modifications, substitutions, and variations of the above embodiments may be made by those of ordinary skill in the art within the scope of the present disclosure.

What is claimed is:

1. A generation method for a magnetic configuration of a magnetic material, wherein comprising
   step 1: using a magneto-optical Kerr measurement system to measure the magnetic material and obtaining an initial magnetic configuration of the magnetic material, turning off the magneto-optical Kerr system, using an X-ray diffractometer to perform diffraction on the magnetic material to obtain an initial atomic configuration, and then turning off the X-ray diffractometer;
   step 2: for the initial magnetic configuration and the initial atomic configuration, randomly generating A random magnetic configurations and B random atomic configurations, thereby creating A×B random configuration combinations, and both A and B being a positive integer;
   step 3: selecting one of the random configuration combinations from step 2 as the target magnetic configuration and the target atomic configuration, according to a Hamiltonian of the magnetic configuration, employing a self-consistent iteration to obtain a constraint constant and a wave function of the target magnetic configuration;
   step 4: based on the target magnetic configuration, the target atomic configuration, the constraint constant and the wavefunction of the target magnetic configuration, determining energy, temperature, and pressure of the target magnetic configuration, and storing the target atomic configuration, the target magnetic configuration, the constraint constant and the wave function of the target atomic configuration, the energy, the temperature, and the pressure of the target magnetic configuration in a magnetic configuration library;
   step 5: returning to step 3, selecting a new random configuration combination from step 2 as the target magnetic configuration and the target atomic configuration, and performing step 6 until all of the random combinations are selected as the target magnetic configuration and the target atomic configuration;
   step 6: updating the magnetic material, and then restarting the magneto-optical Kerr measurement system and the X-ray diffractometer, and performing steps 1 to 5, and performing step 7 when a number of the magnetic configuration and the atomic configuration in the magnetic confirmation library reaches a preset value;
   step 7: using a superconducting quantum interference device to measure a magnetic material to obtain a phase transition temperature, and using the phase transition temperature of the magnetic material, the magnetic configuration, the atomic configuration, and the energy, the temperature and the pressure of the magnetic material to train a deep learning model, and then using the trained deep learning model to obtain the magnetic material in a specified range of the phase transition temperature through the magnetic configuration database.

2. The generation method for the magnetic configuration of the magnetic material according to claim 1, wherein employing a self-consistent iteration to obtain a constraint constant and a wave function of the target magnetic configuration in the step 3, comprising:
   step 331: initializing the constraint constant $v^{\alpha\alpha}$ to 0 and obtaining a target magnetic moment based on the target magnetic configuration;
   step 332: with the constraint constant $v^{\alpha\alpha}$, using the Hamiltonian of the initial magnetic configuration to solve a KS equation to obtain a corresponding wave function $\psi$ as an wave function, determining the wave function $\psi$ according to the following equation:

$$\{H^{KS}+H^V\}|\psi_{n\sigma}\rangle = \epsilon_n|\psi_{n\sigma}\rangle;$$

wherein $H^{KS}$ represents the KS equation, $H^V$ represents the Hamiltonian of the magnetic material, $\psi_{n\sigma}$ represents a $\sigma$ component of a spinon wave function, $\epsilon_n$ represents an eigenvalue, and n represents a $n^{th}$ electron energy level;
   step 333: using a function $M(\Delta v^{\alpha\alpha})$ to update a magnetic moment M of an atom based on the wave function $\psi$ and the constraint constant $v^{\alpha\alpha}$, wherein, the function $M(\Delta v^{\alpha a})$ is determined by a following formula:

$$\Delta H^v(r) \leftarrow -\Delta v^{\alpha a} P_{\sigma\sigma'}^{\alpha} \Theta(r^{cut}-|r-r^a|);$$

$$\{H^{KS}+H^v+\Delta H^v\}|\psi_{n\sigma}\rangle = \epsilon_n|\psi_{n\sigma}\rangle$$

$$m^{\alpha}(r) \leftarrow f_n P_{\sigma\sigma'}^{\alpha} \omega_{n\sigma}(r)\psi_{n\sigma'}(r);$$

$$M^{\alpha a} \leftarrow \int d^3 r\, m^{\alpha}(r)\Theta(r^{cut}-|r-r^a|);$$

wherein $H^V(r)$ represents the Hamiltonian of the magnetic material, $v^{\alpha a}$ represents the constraint constant, $P_{\sigma\sigma'}^{\alpha}$ represents a Pauli matrix in the α direction, θ(•) represents a cutoff function, $r^{cut}$ represents a cutoff radius, r represents a real space coordinate, $r^a$ represents a real space coordinate of an atom a, $M^{\alpha a}$ represents a magnetic moment of atom α in an α direction; $m^{\alpha}(r)$ represents a spin density in the α direction, $f_n$ represents an occupation number on an orbital, $\psi_{n\sigma}$ represents a σ component of the spinon wave function, $\omega_{n\sigma'}$ represents a σ' component of the spinon wave function; $d^3 r$ represents a three-dimensional differential symbol;

step 334: determining whether a difference between the atomic magnetic moment and the target magnetic moment is greater than α preset threshold; if the difference is not greater than the present threshold, performing the step 335, and if the difference is greater than the present threshold, updating the constraint constant $v^{\alpha a}$ according to the following equation and returning to the step 332, and then using a new constraint constant:

$$LCO(M, M_{target}^{\alpha a}) \equiv \mathop{\mathrm{argmin}}_{\Delta v^{\alpha a}} \sum_{a\alpha} (M^{\alpha a} - M_{target}^{\alpha a})^2$$

$$\Delta v^{\rho a} \leftarrow LCO(M, M_{target}^{\alpha a});$$

$$v^{\rho a} \leftarrow v^{\rho a} + \Delta v^{\rho a};$$

wherein $M_{target}^{\alpha a}$ represents the target magnetic moment; $v^{\alpha a}$ represents the constraint constant, $LCO(M, M_{target}^{\alpha a})$ represents the Lagrange coefficient optimization for M and $M_{target}^{\alpha a}$, and M represents the atomic magnetic moment;

step 335: outputting the constraint constant $v^{\alpha a}$ and the wave function ψ at this point; the constraint constant and wave function at this point being the constraint constant and the wave function of the target magnetic configuration.

3. The generation method for the magnetic configuration of the magnetic material according to claim 1, wherein the Hamiltonian in step 3 comprises:

adding a linear energy contribution into the Hamiltonian, the linear energy contribution comprises the constraint constant and the difference between the target magnetic moment and the atomic magnetic moment, and a dimension of the constraint constant in the linear energy contribution is three times the number of atoms, and the atom has different constraint constants in different directions.

4. The generation method for the magnetic configuration of the magnetic material according to claim 1, wherein the step 3 of employing the self-consistent iteration to obtain the constraint constant and the wave function of the target magnetic configuration, comprising:

variation introduced in a local field is proportional to the constraint constant in a process of the self-consistent iteration.

5. The generation method for the magnetic configuration of the magnetic material according to claim 1, wherein a method of obtaining the energy, the temperature and the pressure of the magnetic material is:

obtaining a magnetic moment force based on the constraint constant, obtaining the energy of the magnetic configuration based on the wave function and the constraint constant, or obtaining the energy of the magnetic configuration based on the magnetic moment force; and obtaining the temperature and the pressure of the magnetic configuration based on the magnetic moment force, the magnetic moment, and the atomic configuration.

6. The generation method for the magnetic configuration of the magnetic material according to claim 1, wherein using the phase transition temperature, the magnetic configuration and the atomic configuration of the magnetic material, and the energy, the temperature and the pressure of the magnetic configuration to train the deep learning model in the step 7 is:

taking the magnetic configuration and the atomic configuration of the magnetic material, and the energy, the temperature and the pressure of the magnetic material as an input and taking the phase transition temperature of the magnetic material as an output to train the deep learning model.

7. The generation method for the magnetic configuration of the magnetic material according to claim 1, wherein the step 7 further comprises determining a synthesis process of an object based on the magnetic configuration and a phase transition temperature rang of the magnetic material.

8. A simulation method for a magnetic configuration of a magnetic material, comprising:

step 310: obtaining an initial magnetic configuration and an initial atomic configuration;

step 320: setting a target magnetic configuration and a target atomic configuration, and obtaining a target magnetic moment based on the target magnetic configuration;

step 330: employing a self-consistent iteration to optimize a wave function and a constraint constant according to a Hamiltonian of the magnetic configuration, comprising:

step 331: initializing the constraint constant $v^{\alpha a}$ to 0 and obtaining a target magnetic moment based on the target magnetic configuration;

step 332: with the constraint constant $v^{\alpha a}$, using the Hamiltonian of the initial magnetic configuration to solve a KS equation to obtain a corresponding wave function ψ as the wave function, determining the wave function ψ according to the following equation:

$$\{H^{KS}+H^v\}|\psi_{n\sigma}\rangle = \epsilon_n|\psi_{n\sigma}\rangle;$$

wherein $H^{KS}$ represents the KS equation, $H^V$ represents the Hamiltonian of the magnetic material, $\psi_{n\sigma}$ represents a σ component of a spinon wave function, $\epsilon_n$ represents an eigenvalue, and n represents a $n^{th}$ electron energy level;

step 333: using a function $M(\Delta v^{\alpha a})$ to update a magnetic moment M of an atom based on the wave function ψ and the constraint constant $v^{\alpha a}$, wherein, $$\Delta H^v(r) \leftarrow -\Delta v^{\alpha a} P_{\sigma\sigma'}^{\alpha} \Theta(r^{cut}-|r-r^a|);$$

$$\{H^{KS}+H^v+\Delta H^v\}|\psi_{n\sigma}\rangle = \epsilon_n|\psi_{n\sigma}\rangle$$

$m^\alpha(r) \leftarrow f_n P_{\sigma\sigma'}^\alpha \omega_{n\sigma}(r) \psi_{n\sigma'}(r);$ $M^{\alpha a} \leftarrow \int d^3 r m^\alpha(r) \Theta(r^{cut} - |r - r^a|);$ wherein $H^V(r)$ represents the Hamiltonian of the magnetic material, $v^{\alpha a}$ represents the constraint constant, $P_{\sigma\sigma'}^\alpha$ represents a Pauli matrix in the α direction, $\Theta(\cdot)$ represents a cutoff function, $r^{cut}$ represents a cutoff radius, r represents a real space coordinate, $r^a$ represents a real space coordinate of an atom a, $M^{\alpha a}$ represents a magnetic moment of atom α in an α direction; $m^\alpha(r)$ represents a spin density in the α direction, $f_n$ represents an occupation number on an orbital, $\psi_{n\sigma}$ represents a σ component of the spinon wave function, $\omega_{n\sigma'}$ represents a σ' component of the spinon wave function; $d^3r$ represents a three-dimensional differential symbol;

step 334: determining whether a difference between the atomic magnetic moment and the target magnetic moment is greater than α preset threshold; if the difference is not greater than the present threshold, performing the step 335, and if the difference is greater than the present threshold, updating the constraint constant $v^{\alpha a}$ according to the following equation and returning to the step 332, and then using a new constraint constant:

$$LCO(M, M_{target}^{\alpha a}) \equiv \operatorname*{argmin}_{\Delta v^{\beta a}} \sum_{a\alpha} (M^{\alpha a} - M_{target}^{\alpha a})^2$$

$$\Delta v^{\beta a} \leftarrow LCO(M, M_{target}^{\alpha a});$$

$$v^{\beta a} \leftarrow v^{\beta a} + \Delta v^{\beta a};$$

wherein $M_{target}^{\alpha a}$ represents the target magnetic moment; $v^{\alpha a}$ represents the constraint constant, $LCO(M, M_{target}^{\alpha a})$ represents the Lagrange coefficient optimization for M and $M_{target}^{\alpha a}$, and M represents the atomic magnetic moment;

step 335: outputting the constraint constant $v^{\alpha a}$ and the wave function ψ at this point; the constraint constant and wave function at this point being the constraint constant and the wave function of the target magnetic configuration;

step 340: simulating the magnetic configuration of the magnetic material:

determining spatial positions of all constrained atoms corresponding to the magnetic configuration, a final-state magnetic moment for each atom, an energy of the constrained magnetic configuration, an atomic force experienced by each of the atoms, a magnetic interaction force and a full-degree-of-freedom constraint field as experienced by each atom, based on the constraint constant and the wave function, to achieve the simulation of the target magnetic configuration.

9. The simulation method for a magnetic configuration of a magnetic material according to claim 8, wherein the initial magnetic configuration is under an absolute zero temperature, a zero pressure, and a zero magnetic field.

10. The simulation method for the magnetic configuration of the magnetic material according to claim 8, wherein the step 310 comprises:

obtaining a magnetic moment based on the initial magnetic configuration, and obtaining a position of each of the atoms in the initial magnetic configuration based on the initial atomic configuration.

11. The simulation method for the magnetic configuration of magnetic material according to claim 8, wherein in the step 330, optimizing the wave function and the constraint constant based on the Hamiltonian of the magnetic configuration comprises:

adding a linear energy contribution into the Hamiltonian, the linear energy contribution comprises the constraint constant and the difference between the target magnetic moment and the atomic magnetic moment, and a dimension of the constraint constant in the linear energy contribution is three times the number of atoms, and the atom has different constraint constants in different directions.

12. The simulation method for the magnetic configuration of magnetic material according to claim 8, wherein in the step 330, optimizing the wave function and the constraint constant based on the Hamiltonian of the magnetic configuration comprises:

fixing a spatial position of at least one atom in the initial magnetic system or fixing a magnetic moment of at least one atom in the initial magnetic system to obtain a relaxation process of the magnetic moment of the remaining atoms.

13. The simulation method for the magnetic configuration of magnetic material according to claim 8, determining a synthesis process of an object based on the magnetic configuration of the magnetic material after the magnetic configuration of the magnetic material is simulated.

* * * * *